United States Patent
Heymann et al.

(10) Patent No.: US 9,152,190 B2
(45) Date of Patent: Oct. 6, 2015

(54) COLLAPSIBLE CHIMNEY FOR ELECTRONIC DEVICE

(71) Applicant: Intel Corporation, Santa Clara, CA (US)

(72) Inventors: Douglas Heymann, Hillsboro, OR (US); Jered H. Wikander, Portland, OR (US); Mark MacDonald, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 308 days.

(21) Appl. No.: 13/710,819

(22) Filed: Dec. 11, 2012

(65) Prior Publication Data
US 2014/0160668 A1    Jun. 12, 2014

(51) Int. Cl.
*G06F 1/20* (2006.01)
*H05K 7/20* (2006.01)
*G06F 1/16* (2006.01)

(52) U.S. Cl.
CPC ............. *G06F 1/203* (2013.01); *G06F 1/1616* (2013.01); *G06F 1/1681* (2013.01); *H05K 7/20127* (2013.01)

(58) Field of Classification Search
None
See application file for complete search history.

(56) References Cited

U.S. PATENT DOCUMENTS

| | | | |
|---|---|---|---|
| 6,212,069 B1* | 4/2001 | Janik et al. | 361/679.47 |
| 6,226,180 B1* | 5/2001 | Ueda et al. | 361/689 |
| 6,557,357 B2* | 5/2003 | Spinazzola et al. | 62/89 |
| 6,745,579 B2* | 6/2004 | Spinazzola et al. | 62/89 |
| 6,816,371 B2* | 11/2004 | Agata et al. | 361/679.27 |
| 8,730,665 B2* | 5/2014 | Lewis et al. | 361/679.49 |
| 2005/0073872 A1* | 4/2005 | Suzuki | 365/154 |
| 2005/0170770 A1* | 8/2005 | Johnson et al. | 454/184 |
| 2011/0287704 A1* | 11/2011 | Lewis et al. | 454/184 |

* cited by examiner

*Primary Examiner* — Gregory Thompson
(74) *Attorney, Agent, or Firm* — Alpine Technology Law Group LLC

(57) ABSTRACT

In one embodiment a housing for an electronic device comprises a first section, a second section, and a collapsible chimney coupled to the first section and the second section to provide an airflow path from a portion of the first section. Other embodiments may be described.

15 Claims, 7 Drawing Sheets

COLLAPSIBLE CHIMNEY FOR ELECTRONIC DEVICE

BACKGROUND

The subject matter described herein relates generally to the field of electronic devices and more particularly to a collapsible chimney for one or more electronic devices.

Some electronic devices which generate heat utilize a "clamshell" housing. By way of example, many laptop computers and mobile electronic devices utilize a clamshell housing in which a keyboard is disposed on a first section and a display is disposed on a second section coupled to the first section by a hinge. Alternatively, a "clamshell" can consist of displays, one on a first section that can also be utilized as a touch keyboard and one display on a second section coupled to the first section by a hinge. Heat generated by components in the housing may need to be removed from the housing.

Further, touch screen operation is becoming increasingly common with mobile devices. In some instances touch screen operations may cause the display to rotate due to the force applied to the screen during touch screen operations. Accordingly assemblies to reduce, or at least to inhibit the rotation of a display on a clamshell housing may find utility.

BRIEF DESCRIPTION OF THE DRAWINGS

The detailed description is described with reference to the accompanying figures.

DETAILED DESCRIPTION

Described herein are exemplary embodiments of a chimney for an electronic device, and of electronic devices incorporating such chimneys. In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

In some embodiments, chimneys are employed in electronic devices for cooling purposes such that it eliminates, or at least reduces, the need for active cooling systems such as fans or blowers, which eliminates, or at least reduces, fan acoustic noise and power consumption associated with fans and blowers. The phrase "chimney effect" (or stack effect) refers to the buoyancy-driven movement of air into and out of structures. The chimney effect is responsible for amplifying the air movement associated with natural convection and is used for ventilations in homes, certain heat-producing appliances, etc. Buoyancy results from the difference of air density that is due to temperature differences, moisture differences, etc. Typically, the greater the thermal difference and the height of the structure, the greater the buoyancy force and the chimney effect.

In some embodiment, this chimney or stack effect is used and leveraged such that heated air from components within the electronic device rises up through a ducted passage due to its density being different (i.e., lower) compared to the surrounding air or gas. This helps to maximize, or at least to increase, the airflow by natural draft and increases effectiveness of dissipating the heat generated within the system. It is contemplated that this technique can work with any number of electronic devices, including all types and forms of computer systems.

Figure 1:
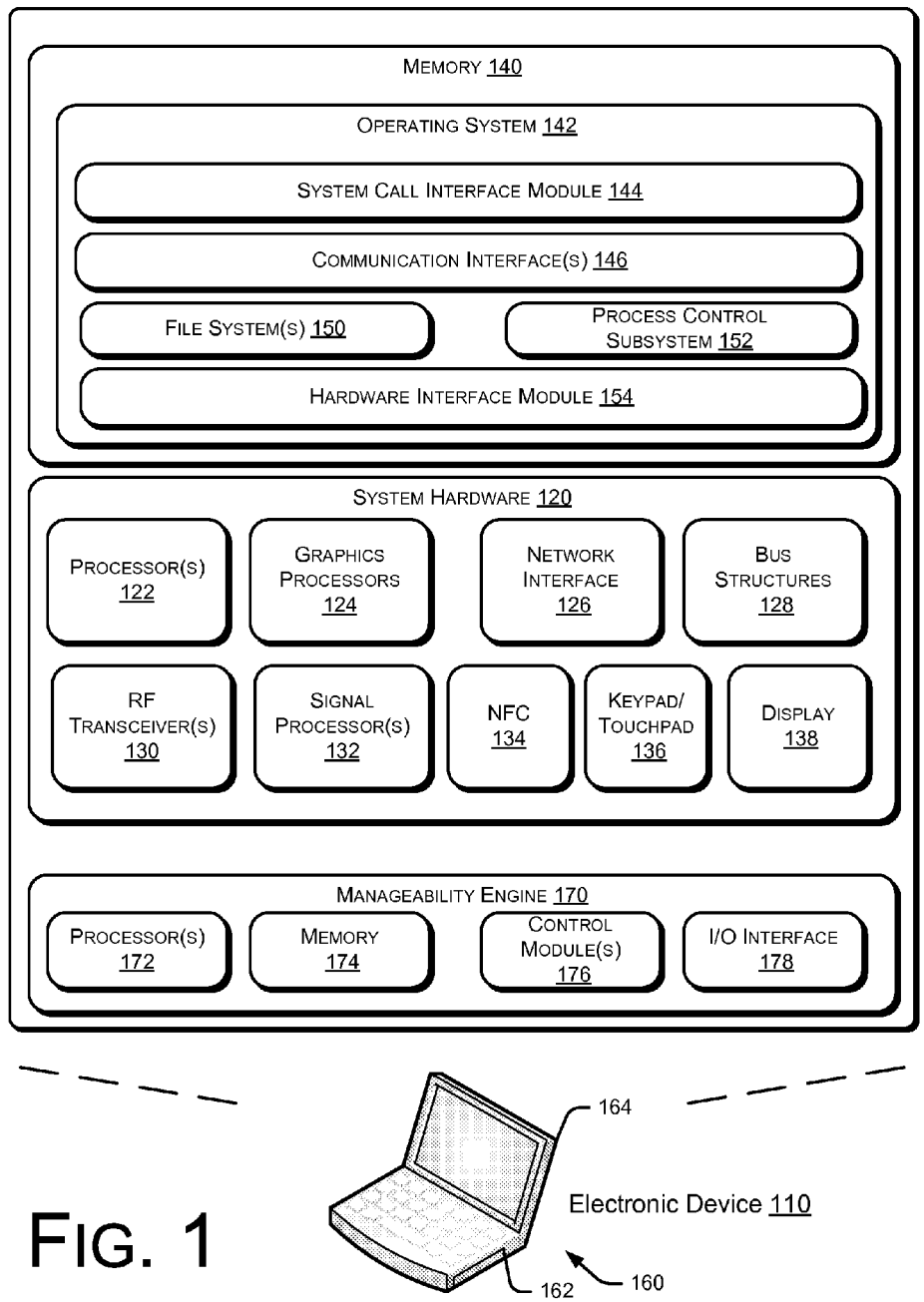
FIG. 1 is a schematic illustration of an exemplary electronic device which may be modified to include a collapsible chimney in accordance with some embodiments.

FIG. 1 is a schematic illustration of an exemplary electronic device 110 which may be adapted to include systems and methods to lock, or at least to inhibit the rotation of a display on a clamshell housing 160 having a first section 162 and a second section 164 in accordance with some embodiments. As illustrated in FIG. 1, electronic device 110 may be embodied as a conventional mobile device such as a laptop computer, a mobile phone, tablet computer portable computer, or personal digital assistant (PDA). The particular device configuration is not critical.

In various embodiments, electronic device 110 may include or be coupled to one or more accompanying input/output devices including a display, one or more speakers, a keyboard, one or more other I/O device(s), a mouse, a camera, or the like. Other exemplary I/O device(s) may include a touch screen, a voice-activated input device, a track ball, a geolocation device, an accelerometer/gyroscope, biometric feature input devices, and any other device that allows the electronic device 110 to receive input from a user.

The electronic device 110 includes system hardware 120 and memory 140, which may be implemented as random access memory and/or read-only memory. A file store may be communicatively coupled to computing device 110. The file store may be internal to computing device 110 such as, e.g., eMMC, SSD, one or more hard drives, or other types of storage devices. File store 180 may also be external to computer 110 such as, e.g., one or more external hard drives, network attached storage, or a separate storage network.

System hardware 120 may include one or more processors 122, graphics processors 124, network interfaces 126, and bus structures 128. In one embodiment, processor 122 may be embodied as an Intel® Atom™ processors, Intel® Atom™ based System-on-a-Chip (SOC) or Intel® Core2 Duo® or i3/i5/i7 series processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of electronic device 110 or may be coupled via an expansion slot on the motherboard or may be located on the same die or same package as the Processing Unit.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI), a High Speed Synchronous Serial Interface (HSI), a Serial Low-power Inter-chip Media Bus (SLIMbus®), or the like.

Electronic device 110 may include an RF transceiver 130 to transceive RF signals, a Near Field Communication (NFC) radio 134, and a signal processing module 132 to process signals received by RF transceiver 130. RF transceiver may implement a local wireless connection via a protocol such as, e.g., Bluetooth or 802.11x. IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a WCDMA, LTE, general packet radio service (GPRS) interface (see, e.g., Guidelines on GPRS Handset Requirements, Global System for Mobile Communications/GSM Association, Ver. 3.0.1, December 2002).

Electronic device 110 may further include one or more input/output interfaces such as, e.g., a keypad 136 and a display 138. In some embodiments electronic device 110 may not have a keypad and use the touch panel for input.

Memory 140 may include an operating system 142 for managing operations of computing device 110. In one embodiment, operating system 142 includes a hardware interface module 154 that provides an interface to system hardware 120. In addition, operating system 140 may include a file system 150 that manages files used in the operation of computing device 110 and a process control subsystem 152 that manages processes executing on computing device 110.

Operating system 142 may include (or manage) one or more communication interfaces 146 that may operate in conjunction with system hardware 120 to transceive data packets and/or data streams from a remote source. Operating system 142 may further include a system call interface module 144 that provides an interface between the operating system 142 and one or more application modules resident in memory 130. Operating system 142 may be embodied as a UNIX operating system or any derivative thereof (e.g., Linux, Android, etc.) or as a Windows® brand operating system, or other operating systems.

In some embodiments an electronic device may include a manageability engine 170, which may comprise one or more controllers that are separate from the primary execution environment. The separation may be physical in the sense that the manageability engine may be implemented in controllers which are physically separate from the main processors. Alternatively, the trusted execution environment may logical in the sense that the manageability engine may be hosted on same chip or chipset that hosts the main processors.

By way of example, in some embodiments the manageability engine 170 may be implemented as an independent integrated circuit located on the motherboard of the electronic device 110, e.g., as a dedicated processor block on the same SOC die. In other embodiments the trusted execution engine may be implemented on a portion of the processor(s) 122 that is segregated from the rest of the processor(s) using hardware enforced mechanisms In the embodiment depicted in FIG. 1 the manageability engine 170 comprises a processor 172, a memory module 174, a control module 176, and an I/O interface 178. In some embodiments the memory module 174 may comprise a persistent flash memory module and the various functional modules may be implemented as logic instructions encoded in the persistent memory module, e.g., firmware or software. The I/O module 178 may comprise a serial I/O module or a parallel I/O module. Because the manageability engine 170 is separate from the main processor(s) 122 and operating system 142, the manageabilty engine 170 may be made secure, i.e., inaccessible to hackers who typically mount software attacks from the host processor 122.

Figure 2A:
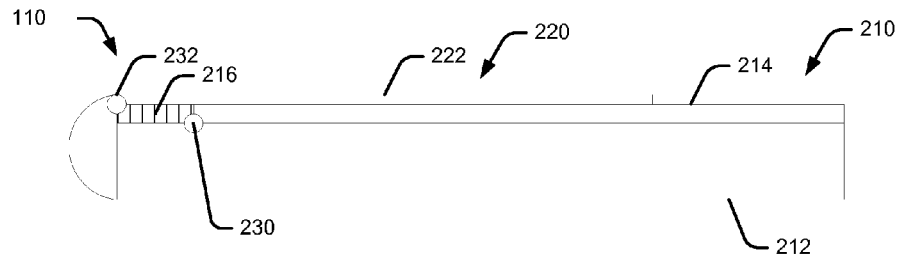
FIGS. 2A-2D are a schematic illustrations of an electronic device comprising a collapsible chimney, in accordance with some embodiments.
Figure 2B:
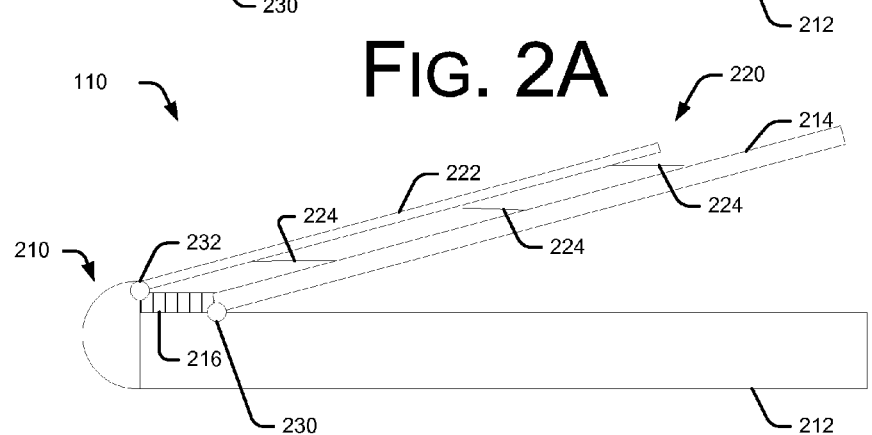
Figure 2C:
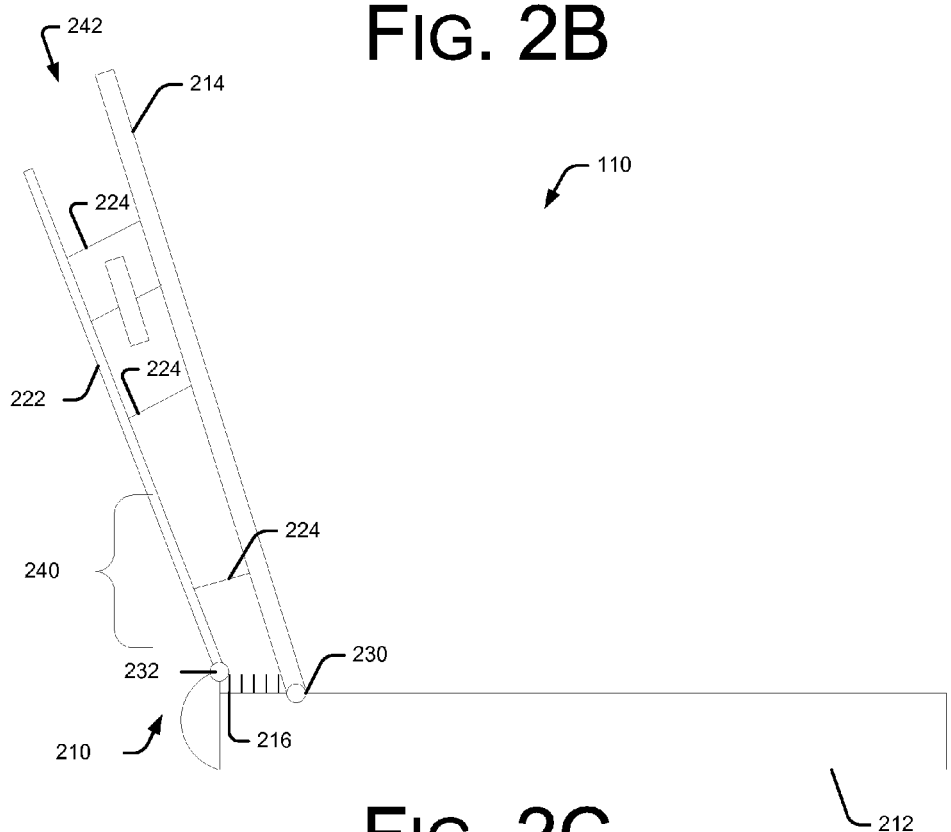
Figure 2D:
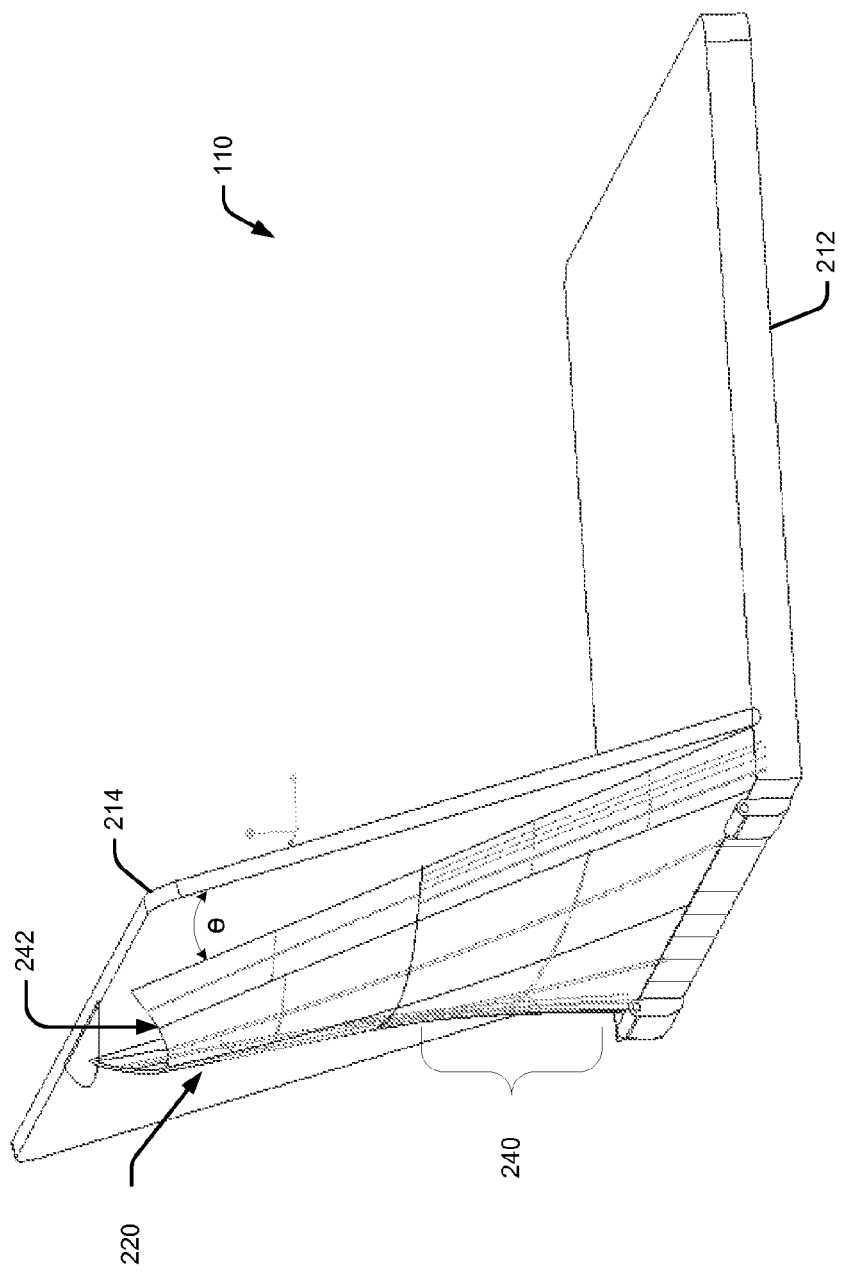

Embodiments of electronic devices comprising a collapsible chimney will be described with reference to FIGS. 2A-2D and FIGS. 3A-5C. Referring first to FIGS. 2A-2D, in some embodiments an electronic device 110 comprises a housing 210 which includes a first section 212 and a second section 214 coupled to the first section by a first hinge assembly 230 and rotatable about the first hinge assembly 230 between a first position in which the housing 210 is closed (FIG. 2A) and a second position in which the housing is open (FIG. 2C). In embodiments in which the electronic device 110 is embodied as a portable computing device the first section 212 may correspond to the base of the portable computing device and may comprise a keyboard and/or other input/output mechanisms, while the second section 214 may correspond to the display of the portable computing device.

In some embodiments a collapsible chimney 220 may be coupled to the first section 212 and the second section 214 to provide an airflow path from a portion of the first section 212 of the housing 210 to the ambient atmosphere to allow heat from one or more components in the first section 212 to escape from the first section 212. In some embodiments the collapsible chimney comprises a panel 222 coupled to the housing 210 by a second hinge assembly 232 and coupled to the second section 214 of the housing by one or more support members 224. In some embodiments cover 222 may be formed from a suitably rigid material, e.g., a polymer or a metallic material, to enable the cover 222 to rotate about hinge assembly 232, while support members 224 may be formed from either a flexible material which allows the cover 222 to move under the force of gravity or from a rigid material which functions as a linkage assembly between the second section 214 of the housing 210 and the cover 210. In either case, the chimney 220 is closed when the housing 210 is in a closed position (FIG. 2A) and is opened when the housing is in an open position (FIG. 2C).

In some embodiments the first section 212 of housing 210 comprises at least one airflow passage 216 in fluid communication with the chimney 220 to allow airflow from the first section 212 of the housing 210 to the chimney 220 when the chimney is open (FIG. 2C). Airflow passage 216 may extend across portions of the first section 212 of housing 210 between the first hinge assembly 230 and the second hinge assembly 132, as illustrated in FIGS. 2A-2C.

The chimney 320 comprises a base section 340 proximate the first section 312 of the housing 310 and an opening 342 distal the base section 340. As best illustrated in FIG. 3C, in some embodiments the chimney 200 is tapered such that the base section has a cross sectional area that is greater than the cross-sectional area of the opening 342.

Figure 3A:
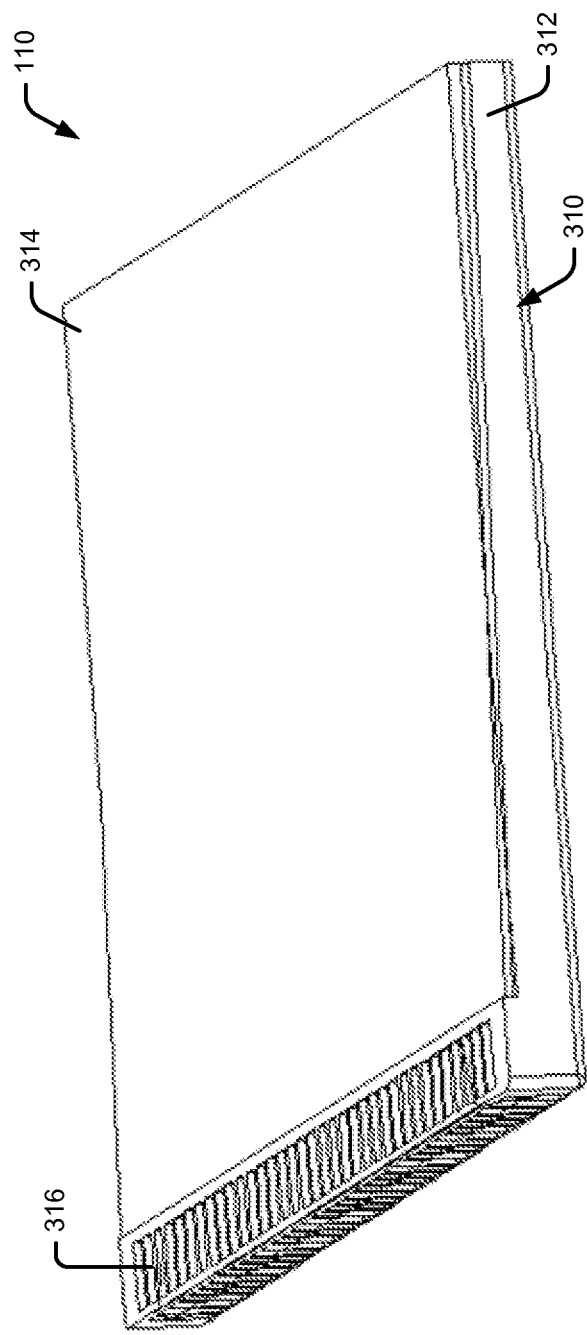
FIGS. 3A-3C are schematic illustrations of an electronic device comprising a collapsible chimney, in accordance with some embodiments.
Figure 3B:
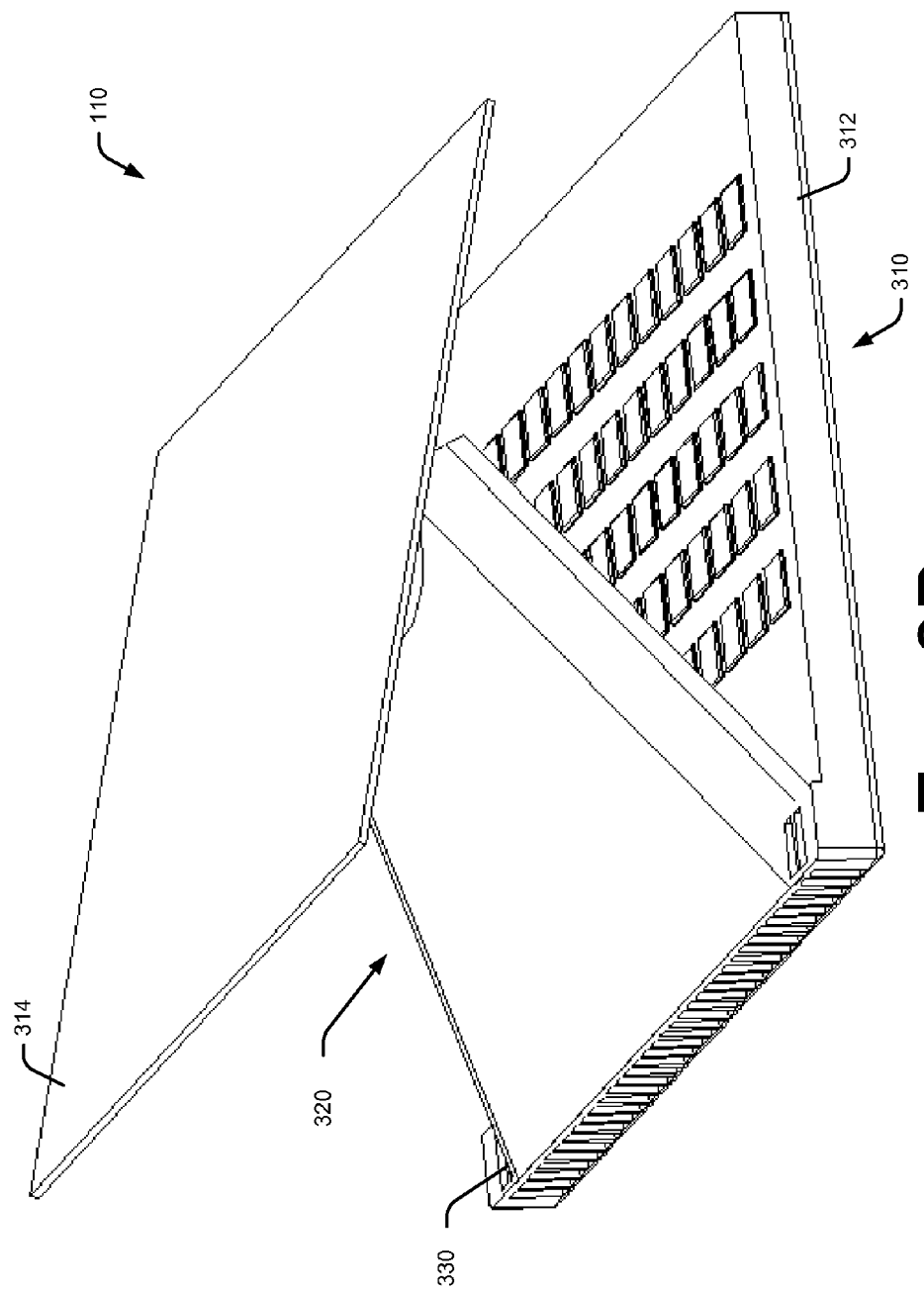
Figure 3C:
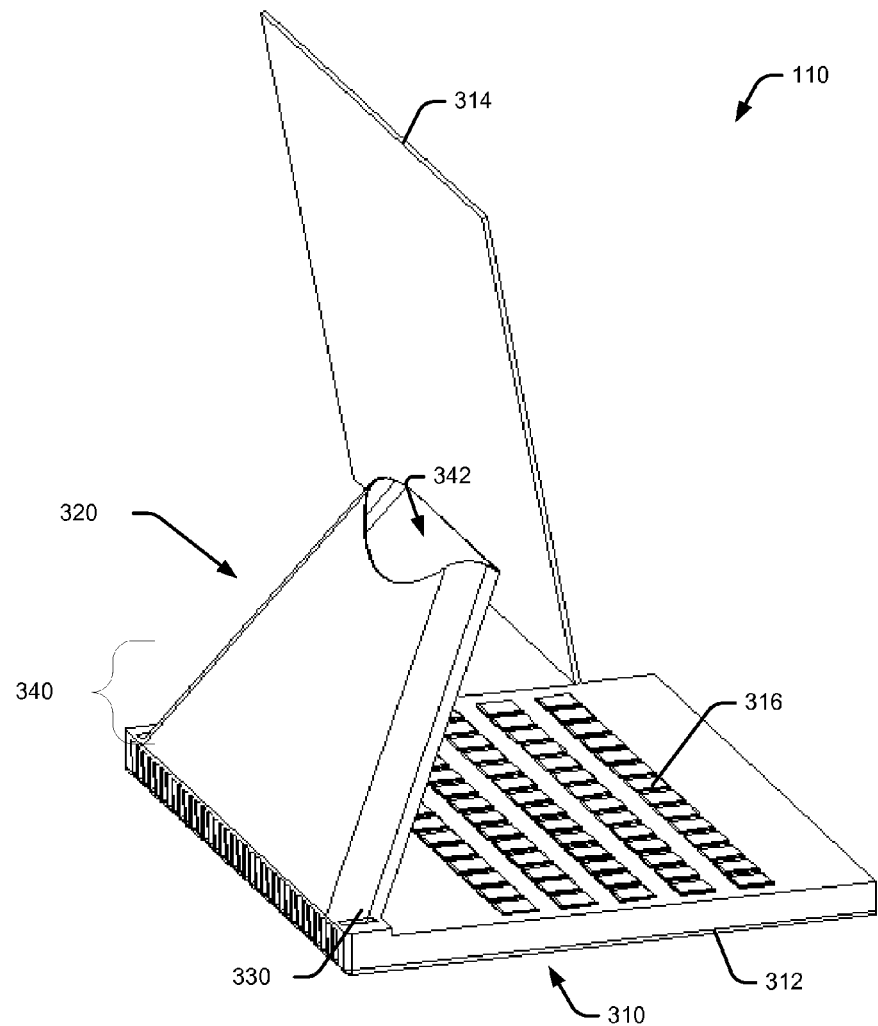

A further embodiment of an electronic device comprising a chimney is illustrated in FIGS. 3A-3C. Referring first to FIGS. 3A-3C, in some embodiments an electronic device 110 comprises a housing 310 and a collapsible chimney 320 coupled to the first section 312 by a hinge assembly 330 and rotatable about the first hinge assembly 230 between a first position in which the housing 310 is closed (FIG. 3A) and a second position in which the housing is open (FIGS. 3B-3C). Housing 310 further comprises a second section 314 coupled to the collapsible chimney 320. In embodiments in which the electronic device 110 is embodied as a portable computing device the first section 312 may correspond to the base of the portable computing device and may comprise a keyboard 316 and/or other input/output mechanisms, while the second section 314 may correspond to the display of the portable computing device.

As described above, collapsible chimney 320 may be coupled to the first section 312 and the second section 314 to provide an airflow path from a portion of the first section 312 of the housing 310 to the ambient atmosphere to allow heat from one or more components in the first section 312 to escape from the first section 312. In some embodiments the collapsible chimney 320 is coupled to the housing 310 by a hinge assembly 330. In some embodiments chimney 320 may be formed from a suitably rigid material, e.g., a polymer or a metallic material, to enable the chimney 320 to rotate about hinge assembly 330. As described above, the chimney 320 is closed when the housing 310 is in a closed position (FIG. 3A) and is opened when the housing is in an open position (FIG. 3C).

In some embodiments the first section 312 of housing 310 comprises at least one airflow passage 316 in fluid communication with the chimney 320 to allow airflow from the first section 312 of the housing 310 to the chimney 320 when the chimney is open (FIG. 2C). Airflow passage 316 may extend across portions of the first section 312 of housing 310 proximate the hinge assembly 330.

Chimney 320 comprises a base section 340 proximate the first section 312 of the housing 310 and an opening 342 distal the base section 340. As best illustrated in FIG. 3C, in some embodiments the chimney 200 is tapered such that the base section has a cross sectional area that is greater than the cross-sectional area of the opening 342.

Figure 4:
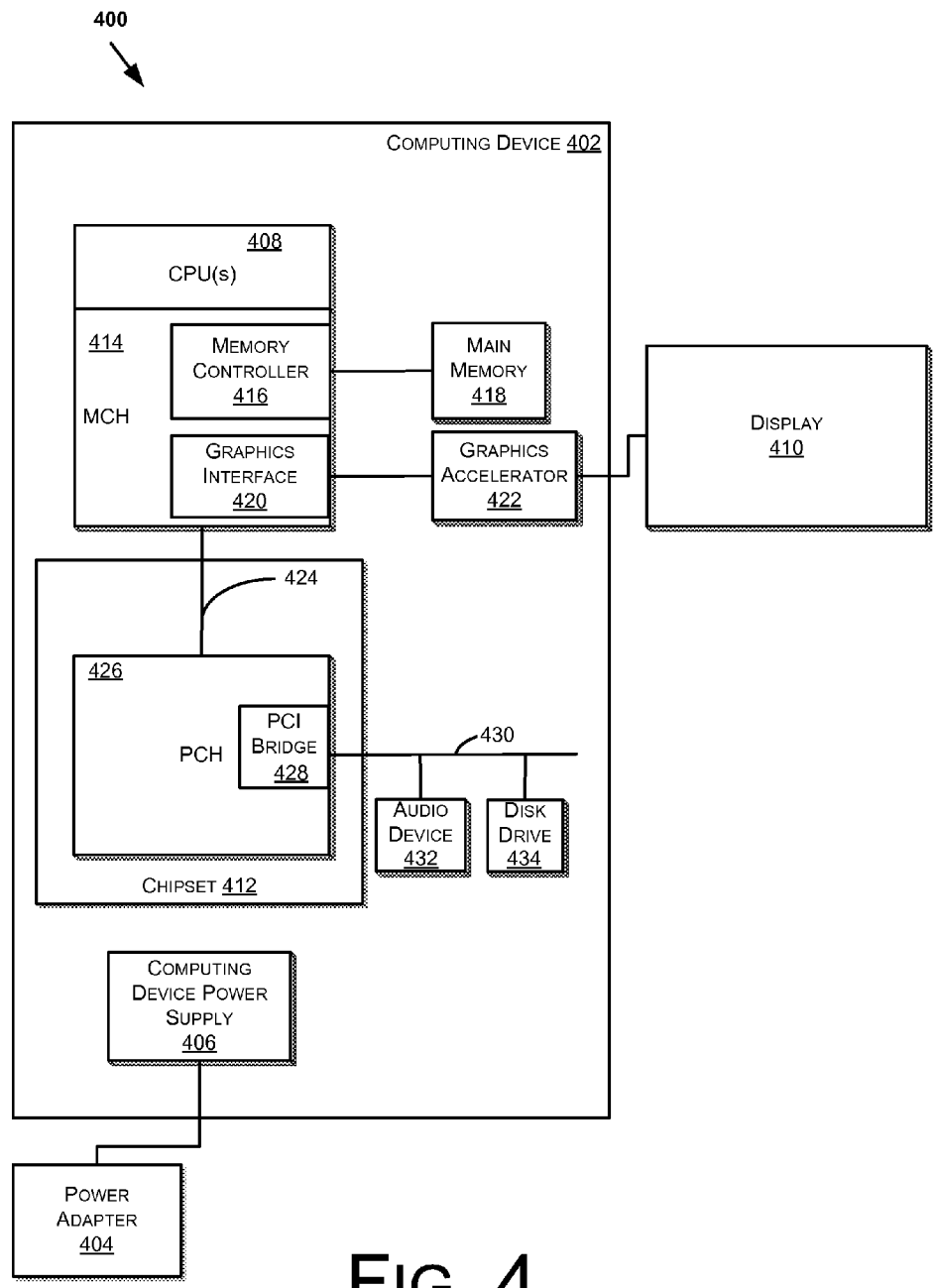
FIG. 4 is a schematic illustration of components of an exemplary electronic device which may be modified to include a collapsible chimney in accordance with some embodiments.

As described above, in some embodiments the electronic device may be embodied as a computer system. FIG. 4 is a schematic illustration of a computer system 400 in accordance with some embodiments. The computer system 400 includes a computing device 402 and a power adapter 404 (e.g., to supply electrical power to the computing device 402). The computing device 402 may be any suitable computing device such as a laptop (or notebook) computer, a personal digital assistant, a desktop computing device (e.g., a workstation or a desktop computer), a rack-mounted computing device, and the like.

Electrical power may be provided to various components of the computing device 402 (e.g., through a computing device power supply 406) from one or more of the following sources: one or more battery packs, an alternating current (AC) outlet (e.g., through a transformer and/or adaptor such as a power adapter 404), automotive power supplies, airplane power supplies, and the like. In some embodiments, the power adapter 404 may transform the power supply source output (e.g., the AC outlet voltage of about 110 VAC to 240 VAC) to a direct current (DC) voltage ranging between about 5 VDC to 12.6 VDC. Accordingly, the power adapter 404 may be an AC/DC adapter.

The computing device 402 may also include one or more central processing unit(s) (CPUs) 408. In some embodiments, the CPU 408 may be one or more processors in the Pentium® family of processors including the Pentium® II processor family, Pentium® III processors, Pentium® IV, or CORE2 Duo processors available from Intel® Corporation of Santa Clara, Calif. Alternatively, other CPUs may be used, such as Intel's Itanium®, XEON, and Celeron® processors. Also, one or more processors from other manufactures may be utilized. Moreover, the processors may have a single or multi core design.

A chipset 412 may be coupled to, or integrated with, CPU 408. The chipset 412 may include a memory control hub (MCH) 414. The MCH 414 may include a memory controller 416 that is coupled to a main system memory 418. The main system memory 418 stores data and sequences of instructions that are executed by the CPU 408, or any other device included in the system 400. In some embodiments, the main system memory 418 includes random access memory (RAM); however, the main system memory 418 may be implemented using other memory types such as dynamic RAM (DRAM), synchronous DRAM (SDRAM), and the like. Additional devices may also be coupled to the bus 410, such as multiple CPUs and/or multiple system memories.

The MCH 414 may also include a graphics interface 420 coupled to a graphics accelerator 422. In some embodiments, the graphics interface 420 is coupled to the graphics accelerator 422 via an accelerated graphics port (AGP). In some embodiments, a display (such as a flat panel display) 440 may be coupled to the graphics interface 420 through, for example, a signal converter that translates a digital representation of an image stored in a storage device such as video memory or system memory into display signals that are interpreted and displayed by the display. The display 440 signals produced by the display device may pass through various control devices before being interpreted by and subsequently displayed on the display.

A hub interface 424 couples the MCH 414 to an platform control hub (PCH) 426. The PCH 426 provides an interface to input/output (I/O) devices coupled to the computer system 400. The PCH 426 may be coupled to a peripheral component interconnect (PCI) bus. Hence, the PCH 426 includes a PCI bridge 428 that provides an interface to a PCI bus 430. The PCI bridge 428 provides a data path between the CPU 408 and peripheral devices. Additionally, other types of I/O interconnect topologies may be utilized such as the PCI Express® architecture, available through Intel® Corporation of Santa Clara, Calif.

The PCI bus 430 may be coupled to an audio device 432 and one or more disk drive(s) 434. Other devices may be coupled to the PCI bus 430. In addition, the CPU 408 and the MCH 414 may be combined to form a single chip. Furthermore, the graphics accelerator 422 may be included within the MCH 414 in other embodiments.

Additionally, other peripherals coupled to the PCH 426 may include, in various embodiments, integrated drive electronics (IDE) or small computer system interface (SCSI) hard drive(s), universal serial bus (USB) port(s), a keyboard, a mouse, parallel port(s), serial port(s), floppy disk drive(s), digital output support (e.g., digital video interface (DVI)), and the like. Hence, the computing device 402 may include volatile and/or nonvolatile memory.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A housing for an electronic device, comprising:
   a first section;
   a second section; and
   a collapsible chimney coupled to the first section and the second section to provide an airflow path from a portion of the first section, wherein the collapsible chimney comprises:
      a base proximate the first section, the base having a first cross sectional area and
      an opening distal the base, the opening having a second cross sectional area, less than the first cross sectional area.

2. The housing of claim 1, wherein:
   the first section comprises at least one airflow passage in fluid communication with the chimney to allow airflow from the first section to the chimney.

3. The housing of claim 1, wherein:
   the second section is coupled to the first section by a first hinge assembly and rotatable about the first hinge assembly between a first position in which the housing is closed and a second position in which the housing is open, and wherein:
      the collapsible chimney is to close when the housing is closed; and
      the collapsible chimney is to open when the housing is open.

4. The housing of claim 3, wherein the collapsible chimney comprises:
   a cover, a portion of which is coupled to the first section by a second hinge assembly; and
   at least one support member to couple the cover to the second section.

5. The housing of claim 1, wherein:
   the collapsible chimney is coupled to the first section by a first hinge assembly and rotatable about the first hinge assembly between a first position in which the collapsible chimney is closed and a second position in which the collapsible chimney is open.

6. The housing of claim 5, wherein the second section is coupled to the collapsible chimney by a second hinge assembly and is rotatable about the second hinge assembly.

7. An electronic device, comprising:
   a housing comprising:
      a first section comprising at least one electronic component;
      a second section comprising; and
      a collapsible chimney coupled to the first section and the second section to provide an airflow path from a portion of the first section, wherein the collapsible chimney comprises:
         a base proximate the first section, the base having a first cross sectional area and
         an opening distal the base, the opening having a second cross sectional area, less than the first cross sectional area.

8. The electronic device of claim 7, wherein:
   the first section comprises at least one airflow passage in fluid communication with the chimney to allow airflow from the first section to the chimney.

9. The electronic device of claim 7, wherein:
   the second section is coupled to the first section by a first hinge assembly and rotatable about the first hinge assembly between a first position in which the housing is closed and a second position in which the housing is open, and wherein:

the collapsible chimney is to close when the housing is closed; and the collapsible chimney is to open when the housing is open.

10. The electronic device of claim 9, wherein the collapsible chimney comprises:
a cover, a portion of which is coupled to the first section by a second hinge assembly; and
at least one support member to couple the cover to the second section.

11. The electronic device of claim 7, wherein:
the collapsible chimney is coupled to the first section by a first hinge assembly and rotatable about the first hinge assembly between a first position in which the collapsible chimney is closed and a second position in which the collapsible chimney is open.

12. The electronic device of claim 11, wherein the second section is coupled to the collapsible chimney by a second hinge assembly and is rotatable about the second hinge assembly.

13. A chimney for an electronic device, comprising:
a body defining an air inlet at a first end and an air outlet at a second end;
the first end coupled to the electronic device by a hinge assembly and rotatable about the hinge assembly between a first position in which the chimney is closed and a second position in which the chimney is open, wherein:
the air inlet has a first cross sectional area and
the air outlet has a second cross sectional area, less than the first cross sectional area.

14. The chimney of claim 13, wherein:
the electronic device comprises at least one airflow passage in fluid communication with the chimney to allow airflow from the first section to the chimney.

15. The chimney of claim 13, wherein the second end is coupled to a display device by a second hinge assembly.

* * * * *